(12) United States Patent
Maruyama (10) Patent No.: US 6,483,623 B1
(45) Date of Patent: Nov. 19, 2002

(54) LAMP APPARATUS FOR USE IN OPTICAL COMMUNICATION AND A PROCESS FOR PRODUCING THE SAME

(75) Inventor: Tsukasa Maruyama, Akita (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 09/201,479

(22) Filed: Nov. 30, 1998

(30) Foreign Application Priority Data

Nov. 28, 1997 (JP) .............................................. 9-344222

(51) Int. Cl.$^7$ ......................... H04B 10/04; H01L 33/00; H01L 23/495; G02F 1/00
(52) U.S. Cl. ....................... 359/180; 359/169; 359/109; 257/98; 257/676
(58) Field of Search ................................ 359/180, 159, 359/169; 257/98, 99, 100, 676

(56) References Cited

U.S. PATENT DOCUMENTS 5,175,783 A * 12/1992 Tatoh ........................... 385/93
5,479,010 A * 12/1995 Shimomura et al. ... 250/231.13
5,959,755 A * 9/1999 Maruyama .................. 359/180

* cited by examiner

Primary Examiner—Jason Chan
Assistant Examiner—M. R. Sedighian
(74) Attorney, Agent, or Firm—Frishauf, Holtz, Goodman & Chick, P.C.

(57) ABSTRACT

Leadframe stock 12 with frame portions 10 on which leadframes 1A and 1B are supported by means of support bridges 11A and 11B, and concave reflector mirror stock 14 with frame portions 16 on which concave reflector mirror 7 is supported by means of support bridges 17 and which are provided with a glossy plate are made by blanking or etching metal sheets and press forming which is applied to make the concave reflector mirror stock 14; the two stocks are made integral by joining their respective frame portions; the essential parts of the stocks including an LED chip and the concave reflector mirror 7 are molded with light-transmissive resin 2 such that they are completely buried in the resin; the support bridges 11A, 11B and 17 are then cut off to sever the individual frame portions to produce a reflecting LED lamp apparatus that is rigid, highly resistant to heat and commercially available at low cost.

8 Claims, 7 Drawing Sheets

LAMP APPARATUS FOR USE IN OPTICAL COMMUNICATION AND A PROCESS FOR PRODUCING THE SAME

BACKGROUND OF INVENTION

This invention relates to a reflecting LED lamp apparatus having a parabolic reflecting surface disposed in a face-to-face relationship with a light-emitting device. The invention also relates to a process for producing the apparatus.

There is known a lamp apparatus for use in optical communication that has a parabolic or concave reflecting surface disposed in a face-to-face relationship with an LED chip that is mounted on a leadframe to face away from the radiation of light such that the reflected light will produce a directional beam. This type of lamp apparatus is described in many patents including Unexamined Published Japanese Utility Model Application (kokai) No. 87567/1989, as well as Unexamined Published Japanese Patent Application (kokai) Nos. 209124/1994, 211940/1995 and 55540/1997.

Figure 8:
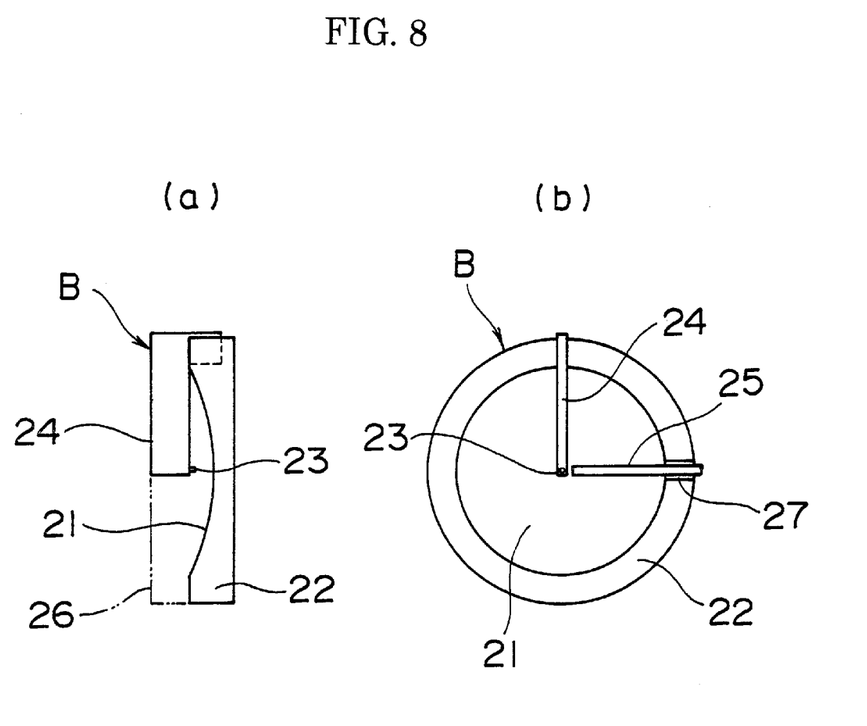
FIG. 8a is a side view of a conventional LED lamp.
FIG. 8b is a plan view of the same lamp.

Unexamined Published Japanese Utility Model Application No.87567/1989 discloses an LED lamp which is generally indicated by B in FIG. 8 and which comprises a metal base 22 having a parabolic concave mirror 21 on a surface that is joined to a light-transmissive resin 26 molded in such a way as to cover a lead plate 24 having an LED chip 23 mounted thereon and a lead plate 25 disposed in proximity to the lead frame 24.

Unexamined Published Japanese Patent Application No.209124/1994 discloses a photoelectronic apparatus that has a reflector mirror combined with a leadframe having a semiconductor chip mounted thereon and that has all components but the leg portions of the leadframe encapsulated with a light-transmissive resin to form a monolithic unit.

Unexamined Published Japanese Patent Application No. 211940/1995 discloses an LED apparatus that comprises a frame member made of an opaque resin having a recess formed in a reflecting surface and a leadframe with an LED chip that is mounted on a frame member, with all components being encapsulated with a transparent or semitransparent resin.

Unexamined Published Japanese Patent Application No. 55540/1997 discloses a light emitter that comprises a pedestal with a concave surface to be mounted on a substrate and a light-emitting diode device that is joined to said pedestal and which comprises a light-emitting element, lead terminals and a light-transmissive resin package that encapsulates said light-emitting element and lead terminals and which has a convex surface that fits said concave surface.

These prior art apparatus, however, have various problems. In the LED lamp B shown in FIG. 8 according to Unexamined Published Japanese Utility Model Application No. 87567/1989, the high heat from the reflow soldering as applied for surface mounting on a substrate passes through the metal base 22 to be directly transmitted to the interface between the concave mirror 21 and the light-transmissive resin package 26 so that cracking or peeling may potentially occur at the interface on account of the thermal expansion mismatch and this introduces difficulty in achieving surface mounting by reflow soldering. In addition, the parabolic surface of the concave mirror 21 is formed by polishing which is a time-consuming operation. As a further problem, in order to ensure electrical insulation between the concave mirror 21 and the lead plate 25, the latter must be made "floating" from the associated mounting groove on the surface of the metal base 22 but then a spacer 27 to prevent leakage of light from the groove must be interposed by a complex fitting procedure.

In the invention described in Unexamined Published Japanese Patent Application No. 209124/1994, the reflector mirror is mounted on the leadframe by means of various engaging elements and this increases the complexity of the operations for working and assembling the engaged portions; as a result, the temperature variations that occur when the lamp is turned on and off impose a significant load on the engaged portions to eventually shorten the operating life of the LED. In addition, as the lamp size decreases, the size of the engaging elements will unavoidably become smaller, making it more difficult to perform the working and assembling operations. What is more, the small engaged portions result in a weaker joining force, which many potentially produce an instable joint. If resin sealing is attempted in spite of the instable joint, the resin will get into any gap present in the joined area and the reflector mirror is offset from the correct position to eventually cause a serious adverse effect on the optical characteristics of the lamp. Further in addition, if the reflector mirror is to be formed of an insulator such as a plastic material with a thin reflective metal film, a cumbersome evaporating or sputtering procedure must be performed to give a uniform thickness of metal film but then a vacuum drawing apparatus and other large-scale and expensive, dedicated equipment become necessary.

In the invention described in Unexamined Published Japanese Patent Application No. 211940/1995, the reflective surface is formed of an opaque resin and hence has a problem with surface gloss compared to the metallic reflecting surface. In addition, the leadframe is simply placed on the frame member to have contact with grooves cut in the area surrounding the reflecting surface but this presents problems not only with electrical insulation but also the leakage of light from the groove.

In the invention described in Unexamined Published Patent Application No. 55540/1997, the pedestal is made of a resin and its concave surface is typically coated with an evaporated film of a reflective metal such as aluminum, with the evaporated film in turn being protected with a resin overcoat. Because of this layer arrangement, the light emitter requires a complicated process to fabricate. In addition, the interface between the reflector mirror and the light-emitting diode device might undergo peeling or delamination due to aging from the moisture in the surrounding atmosphere and other factors.

To summarize, the prior art lamp apparatus for use in optical communication have had the following problems.
(1) Generally speaking, the manufacturing process consists of so many steps that it is not highly efficient in mass production, and it requires dedicated, large-scale equipment for creating a reflective surface, thus increasing the cost of the product.
(2) In a particular case where the metal reflecting surface is coupled to lead terminals by joining or by means of engaging elements, the temperature variations that occur when the lamp is turned on and off will impose a significant load on the coupled area, thereby causing adverse effects on the operating life of the LED lamp.
(3) Further, in order to produce an apparatus of the type that requires the formation of a thin metallic reflective surface by evaporation or sputtering, dedicated large-scale equipment such as a vacuum drawing apparatus must be employed to reduce the unevenness in the thickness of the reflector and this has limited the effort to reduce the initial cost.

(4) When the thin metallic reflective surface is exposed to high temperatures from reflow soldering during surface mounting of the lamp apparatus on a substrate, it may fail to withstand the thermal expansion mismatch with the contacting resin material, whereupon cracking or delamination occurs to cause its deterioration.

(5) If the reflecting surface is provided with a resin coat, air atmosphere or moisture may permeate into the interface, thereby causing time-dependent deterioration due to the peeling of the reflector.

SUMMARY OF THE INVENTION

The present invention has been accomplished under these circumstances and has as an object providing a reflecting LED lamp apparatus of a type that has a concave reflecting surface formed in a face-to-face relationship with an LED chip, which is improved in that it can be produced by a significantly simplified, hence highly productive, commercial manufacturing process, is rigid, has high heat resistance as exemplified by insensitivity to the heat applied during surface mounting, will not undergo time-dependent deterioration and is available at low cost.

Another object of the present invention is to provide a process for producing such an improved LED lamp apparatus.

In order to attain its first object, the present invention provides a lamp apparatus for use in optical communication that comprises leadframes having an LED chip mounted on a lead terminal and a material having a concave reflector mirror opposed to said LED chip and which is resin molded monolithically with said leadframes, said lamp apparatus being produced by a process comprising the steps of making a unitary assembly of a metallic leadframe stock with frame portions on which leadframes are supported by means of support bridges and a concave reflector mirror stock with frame portions on which a concave reflector mirror is supported by means of support bridges, said unitary assembly being formed by joining the frame portions of the leadframe stock to those of the concave reflector mirror stock, completely burying said LED chip, said lead terminal and said concave reflector mirror within a light-transmissive resin by molding, and cutting off the support bridges of said leadframe and those of said concave reflector mirror so that the frame portions of the respective components are severed.

In an embodiment, said leadframe stock with frame portions is obtained from a metal sheet by blanking or etching.

In another embodiment, said concave reflector mirror stock with frame portions is obtained by first blanking or etching a metal sheet and then press forming it.

In yet another embodiment, said lead terminal is bent such that it straddles the peripheral edge of said concave reflector mirror without contacting it.

In still another embodiment, said leadframe stock with frame portions and said concave reflector mirror stock with frame portions are obtained from metallic sheets of the same material and thickness.

In further embodiment, the central area of the underside of said light-transmissive resin in which said lead terminal and said concave reflector mirror are buried is shaped to protrude downwardly, those portions of a pair of said leadframes which are exposed to the outside of said light-transmissive resin are bent downward along the outer lateral sides of said light-transmissive resin whereas the end portions of said leadframes are bent back to become level with the underside of said light-transmissive resin, thereby forming apparatus supporting surfaces.

To attain its second object, the present invention provides a process for producing a lamp apparatus for use in optical communication that comprises leadframes having an LED chip mounted on a lead terminal and a material having a concave reflector mirror opposed to said LED chip and which is resin molded monolithically with said leadframes, said process comprising the steps of blanking or etching a metal sheet to make a leadframe stock with frame portions on which leadframes are supported by means of support bridges, blanking or etching a metal sheet and press forming it to make a concave reflector mirror stock with frame portions on which a concave reflector mirror is supported by means of support bridges, forming a unitary assembly of said leadframes and said concave reflector mirror by joining their respective frame portions, completely burying said LED chip, said lead terminal and said concave reflector mirror within a light-transmissive resin by molding them with the resin, and cutting off the support bridges of said leadframes and those of said concave reflector mirror so that the frame portions of the respective components are severed.

In an embodiment, a plurality of said leadframe stocks with frame portions are formed in a single metal sheet and a corresponding number of said concave reflector mirror stocks with frame portions are formed in a single metal sheet and said leadframe stocks are joined to the corresponding concave reflector mirror stocks, molded with a resin altogether and followed by resin molding of the entire assembly and severing of the respective frame portions so as to produce a plurality of lamp apparatus simultaneously.

In another embodiment of its first aspect, the present invention provides a lamp apparatus for use in optical communication that allows for spatial transmission of sound and image data from a video camera to a television monitor equipped with a light-receiving device.

In yet another embodiment of its first aspect, the present invention provides a lamp apparatus for use in optical communication that allows for spatial transmission of image data from a digital camera to a computer equipped with a light-receiving device.

In still another embodiment of its first aspect, the present invention provides a lamp apparatus for use in optical communication that allows for the distance between successively running automobiles to be measured from above a traffic signal.

In a further embodiment of its first aspect, the present invention provides a lamp apparatus for use in optical communication that allows for the detection of an object approaching a restricted area.

In a still further embodiment of its first aspect, the present invention provides a lamp apparatus for use in optical communication that allows for remote control of a consumer electric or electronic appliance equipped with a light-receiving device.

In yet another embodiment of its first aspect, the present invention provides a lamp apparatus for use in optical communication that allows for spatial transmission of light in a local area network (LAN).

THE PREFERRED EMBODIMENT OF THE INVENTION

The lamp apparatus of the present invention will now be described with reference to the preferred embodiment shown in FIGS. 1–7.

Figure 1:
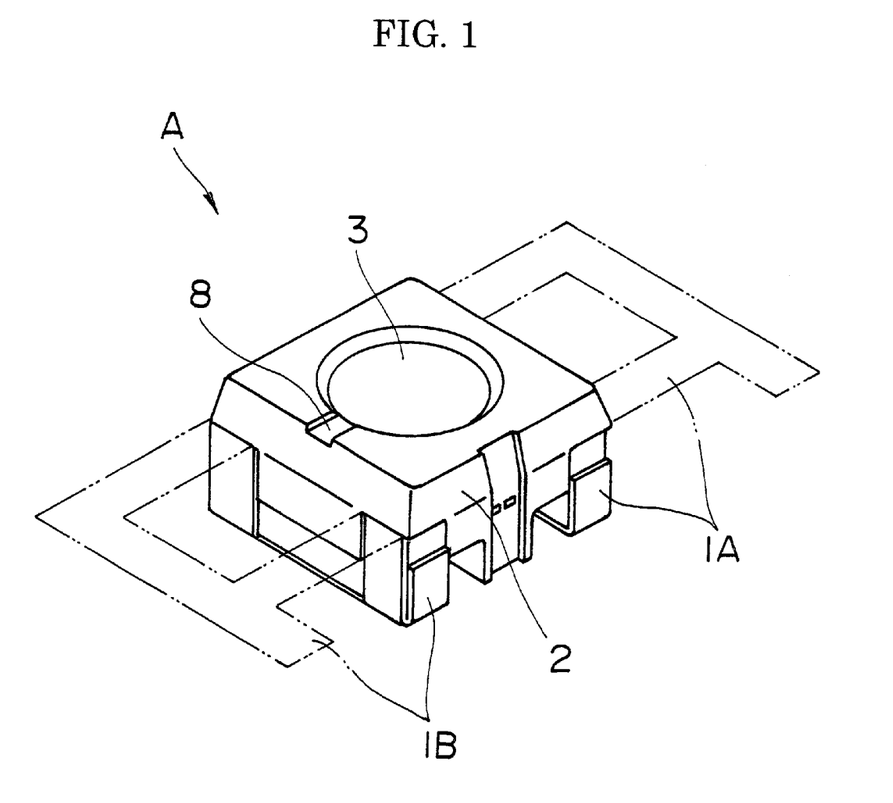
FIG. 1 is a perspective view showing the exterior of the lamp apparatus of the present invention.
Figure 2:
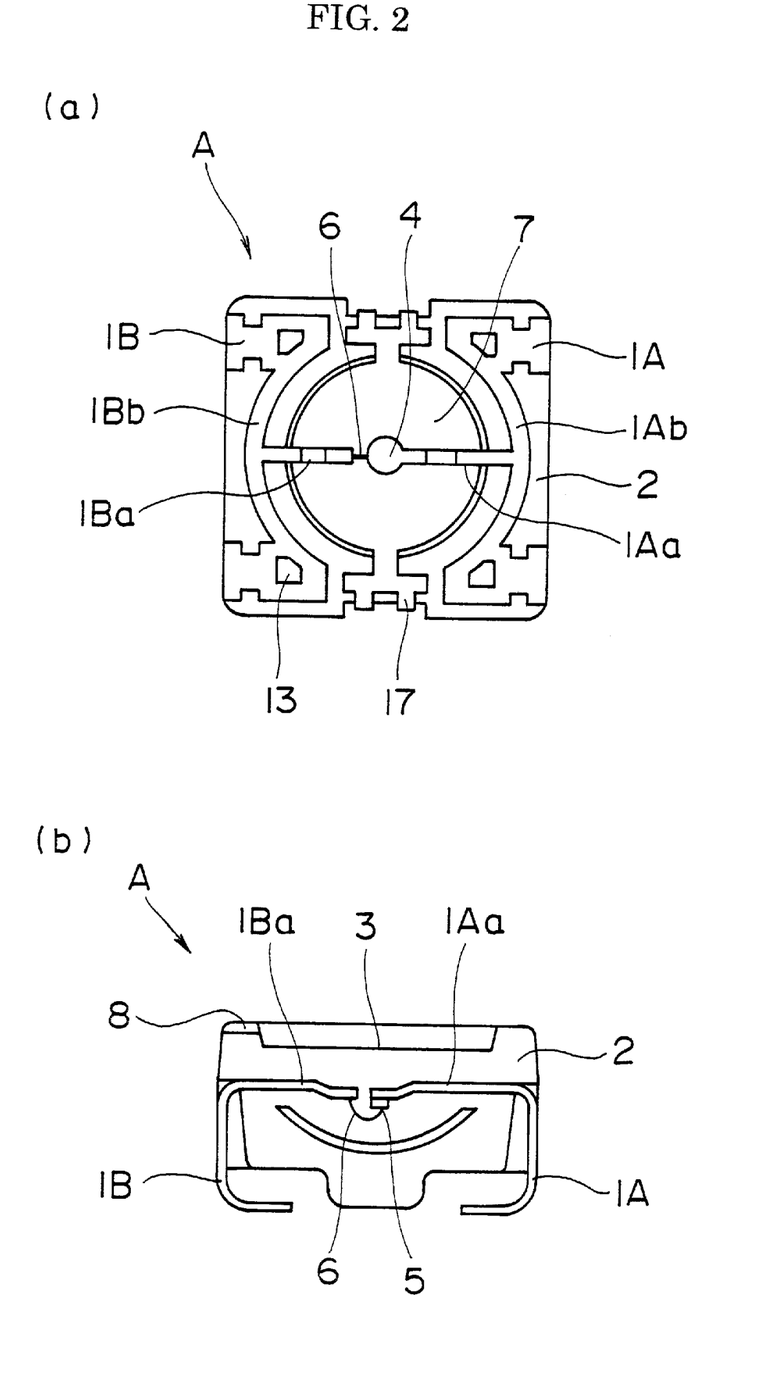
FIG. 2a is a cross section of the lamp apparatus shown in FIG. 1.
FIG. 2b is a vertical section of the lamp apparatus shown in FIG. 1.

The lamp apparatus of the present invention which is generally indicated by A in FIG. 1 comprises a concave reflector mirror (not shown) and a pair of leadframes 1A and 1B that are disposed forward of (upward in FIG. 1) and in a face-to-face relationship with the reflector mirror such that not only the reflector mirror but also the terminal portions of the leadframes are molded with a light-transmissive resin 2 to become completely surrounded by and buried in the resin; subsequently, a light pickup window 3 is provided in the front surface of the molding and the base portions of the leadframes 1A and 1B are bent back to form a surface mounting portion of the lamp device A.

As shown more specifically in section in FIGS. 2a and 2b, the lamp apparatus A has an LED chip 5 mounted on the back of a round 4 provided at the distal end of a lead terminal 1Aa of the leadframe 1A in plate form; a gold wire 6 is bonded to establish connection between the lead terminal 1Aa and the other lead terminal 1Ba which is opposed diametrically thereto; the concave reflector mirror 7 which is made of a metal in plate form is disposed backward of and in a face-to-face relationship with the LED chip 5 and the components mentioned above are molded with the light-transmissive resin 2 such that they are completely surrounded by and buried within the resin. The central area of the underside of the molding is shaped to protrude downward and those portions of the leadframes 1A and 1B which are exposed to the outside of the molding are formed such that they are bent along the lateral sides of the molding and the base portions of the respective leadframes are bent back to provide apparatus supporting surfaces. This procedure provides a rigid and compact apparatus of a type that can be surface mounted on a substrate. Indicated by 8 is a marking groove which shows that the surface of the apparatus on which it is provided is on the cathode side.

Figure 3:
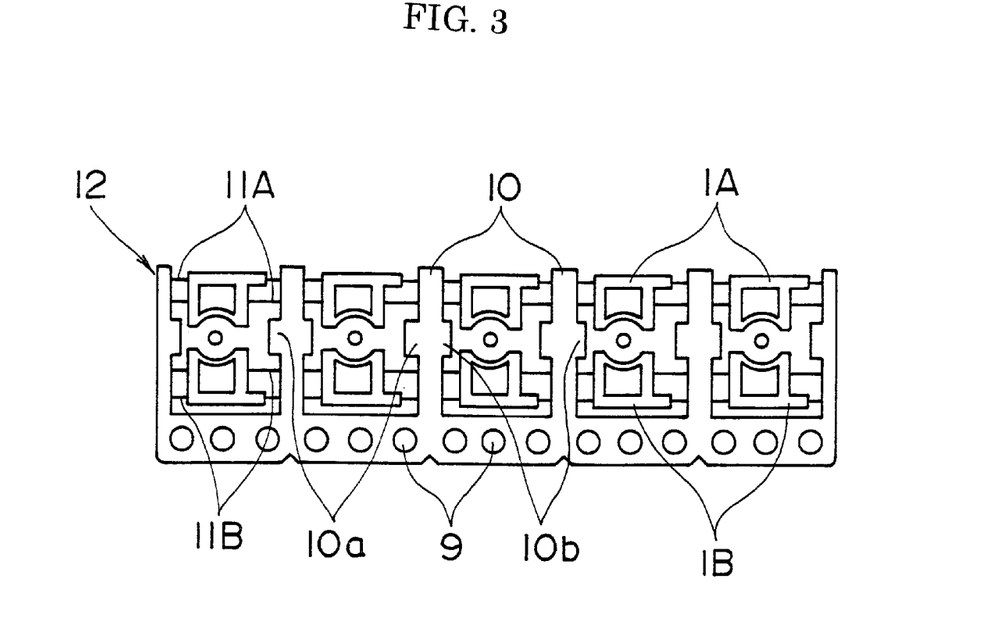
FIG. 3 is a plan view of a leadframe stock with frame portions for use in the present invention.

FIG. 3 shows a step in the process of making the leadframe stock 12 with frame portions. A single moving metal sheet having a linear array of positioning holes 9 made along one edge is subjected to a single shot of blanking operation so as to form plural sets of leadframes 1A and 1B (five sets are shown in FIG. 3) that are connected in series by being supported on frame portions 10 by means of support bridges 11A and 11B. As shown enlarged in part in FIG. 5, the leadframe 1A on the anode side on which the LED chip 5 (see FIG. 2) is to be mounted and the opposed leadframe 1B on the cathode side are disposed symmetrically to each other and the leadframe 1A is supported on the frame portions 10 by means of two pairs of support bridges 11A whereas the leadframe 1B is supported on the same frame portions 10 by means of two pairs of support bridges 11B.

Figure 5:
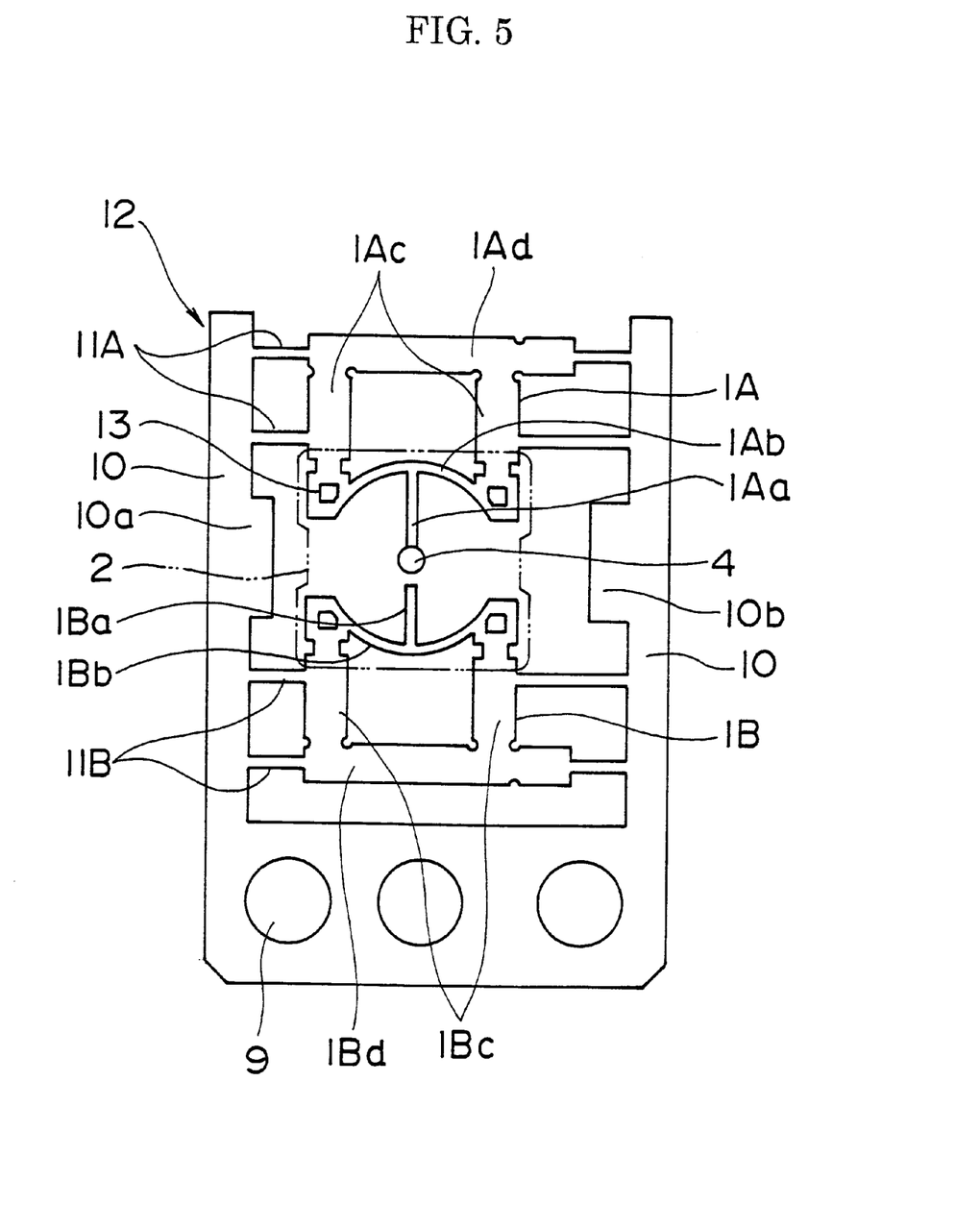
FIG. 5 is a partial enlarged plan view of the leadframe stock with frame portions that is shown in FIG. 3.

The two leadframes 1A and 1B respectively have lead terminals 1Aa and 1Ba disposed at their distal end; the lead terminal 1Aa on the anode side has the round 4 provided at the tip for mounting the LED chip 5 and is opposed to the tip of the lead terminal 1Ba on the cathode side, with a certain clearance being maintained. The two lead terminals 1Aa and 1Ba are connected at their base end to arcuate lead-ins 1Ab and 1Bb, respectively, which in turn are connected at opposite ends to lead bases 1Ad and 1Bd via leg-shaped lead bridges 1Ac and 1Bc. Each of the lead bases 1Ad and 1Bd is elongated to both right and left, with one end projecting to provide an area available as an electrode portion.

After being formed by blanking, each of the lead terminals 1Aa and 1Ba is press formed in its intermediate position to be bent downward and its distal end portion is maintained level with a position somewhat below the plane of the blank sheet (see FIG. 7). Each of the lead-ins 1Ab and 1Bb has an engagement hole 13 formed at both ends for providing engagement with the molding resin. The intermediate areas of the two frame portions 10 that are opposed to the site where the two lead terminals 1Aa and 1Ba face each other form projections 10a and 10b of a specified width that extend inwardly to face each other. These projections 10a and 10b are so shaped that they can be joined to corresponding projections 16a and 16b of a concave reflector mirror stock 14 with frame portions that is to be described below. In FIG. 5, the light-transmissive resin 2 which is used to mold the necessary components of the lamp apparatus is shown by a phantom line.

Figure 4:
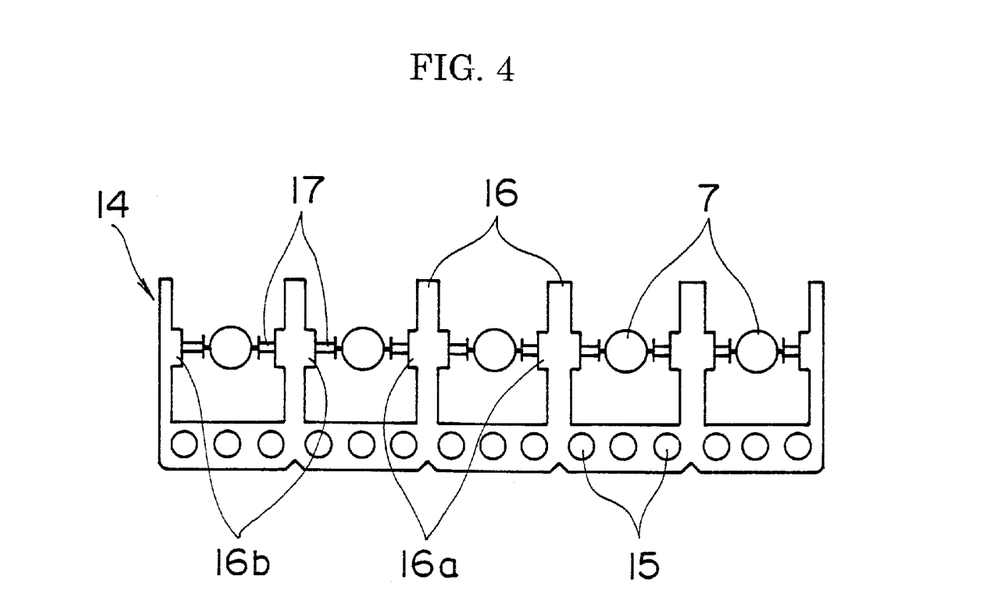
FIG. 4 is a plan view of a concave reflector mirror stock with frame portions for use in the present invention.

FIG. 4 shows the concave reflector mirror stock 14 with frame portions that has as many concave reflector mirrors 7 (five mirrors in FIG. 4) as the sets of leadframes 1A and 1B in the leadframe stock 12 with frame portions. As in the case of the leadframe stock 12 with frame portions, a metal sheet having a linear array of positioning holes 15 on one edge is blanked or etched and subsequently press formed to form the concave reflector mirror stock 14 with frame portions. Thus, individual concave reflector mirrors 7 are obtained by press forming a flat metal sheet into concavity after it has been blanked or etched.

Figure 6:
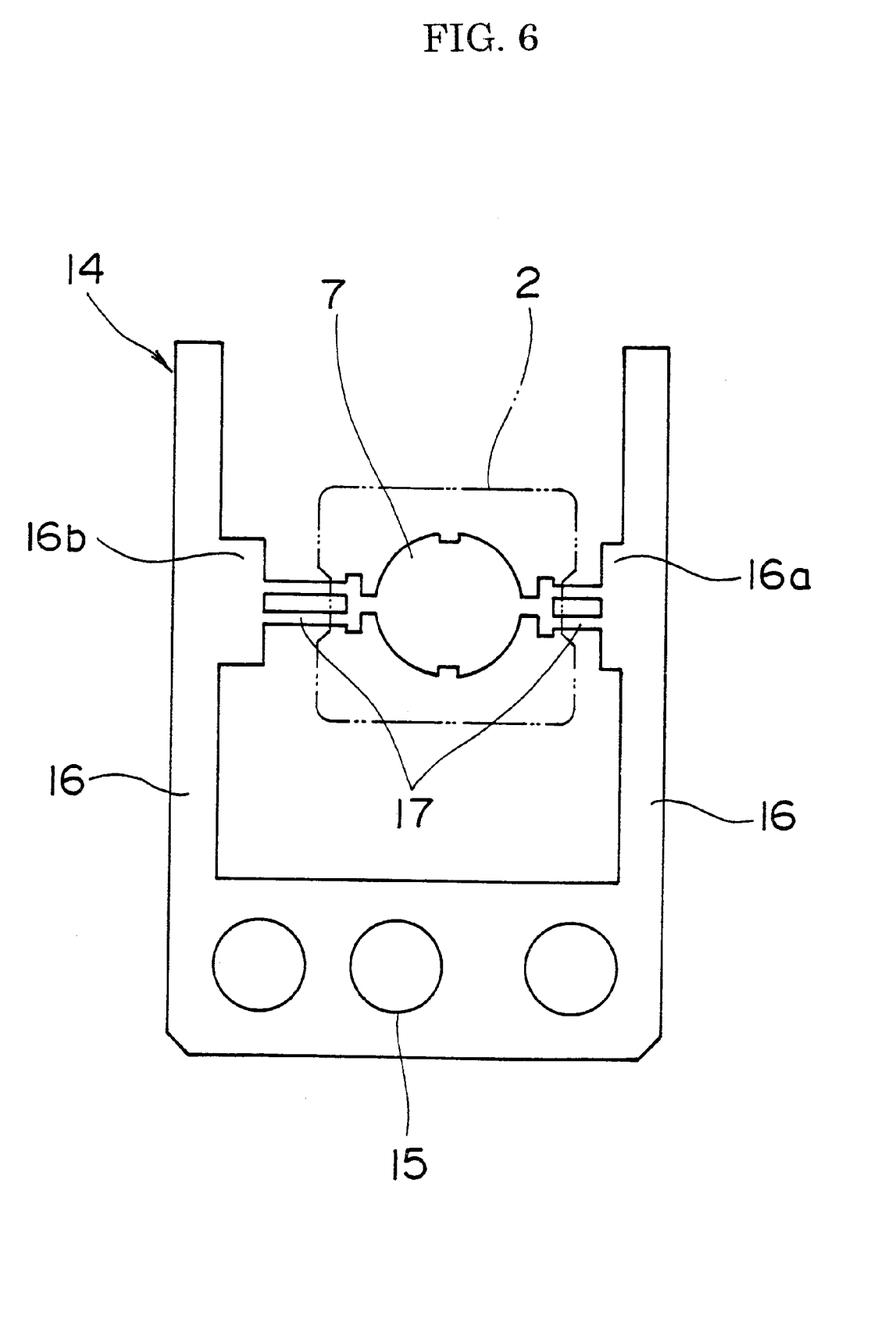
FIG. 6 is a partial enlarged plan view of the concave reflector mirror stock with frame portions that is shown in FIG. 4.

As shown enlarged in FIG. 6, the individual concave reflector mirror 7 is adapted to be supported via support bridges 17 on the projections 16a and 16b of a specified width that are provided in the intermediate areas of the two frame portions 16. Upon press forming, each of the support bridges 17 is bent down either at the distal end or in the intermediate position so that the concave reflector mirror 7 is maintained level with a position below the plane of the blank sheet (see FIG. 7)

As already mentioned, the projections 16a and 16b are so shaped that the corresponding projections 10a and 10b of the leadframe stock 12 with frame portions can be joined to them by superposing. When these two sets of projections are joined together by spot welding, the LED chips mounted on the lead terminal 1Aa of the leadframe stock 12 with frame portions is positioned at the focus of the associated concave reflector mirror 7. It should also be noted that when the projections 10a and 10b are thus joined to the projections 16a and 16b, the lead terminals 1Aa and 1Ba will not contact the concave reflector mirror 7 but "float", i.e., straddle the peripheral edge of the mirror. In FIG. 6, the light-transmissive resin 2 which is used to mold the necessary components of the lamp apparatus is shown by a phantom line.

The leadframe stock 12 with fame portions and the concave reflector mirror stock 14 with frame portions that have been described above are obtained by blanking copper alloy sheets that have the same thickness (0.15 mm) and that are plated over the entire surface with nickel in a thickness of 1 $\mu$m and silver in a thickness of 2 $\mu$m. It should be particularly mentioned that the plating on the sheet for the concave reflector mirror stock 14 with frame portions is finished to have an average gloss of 0.8 or more. The two sheets need not be made of the same material nor are they required to have the same thickness. The advantage of using sheets of the same material and thickness is that the overall manufacturing process is further simplified.

The subsequent procedure goes in the following manner. First, the LED chip 5 is mounted on the back of the round 4 at the lead terminal 1Aa of the leadframe 1A in the leadframe stock 12 with frame portions. The electrode portion of the LED chip 5 is bonded to the lead terminal 1Ba of the lead frame 1B by means of the gold wire 6 (see FIG. 2).

Figure 7:
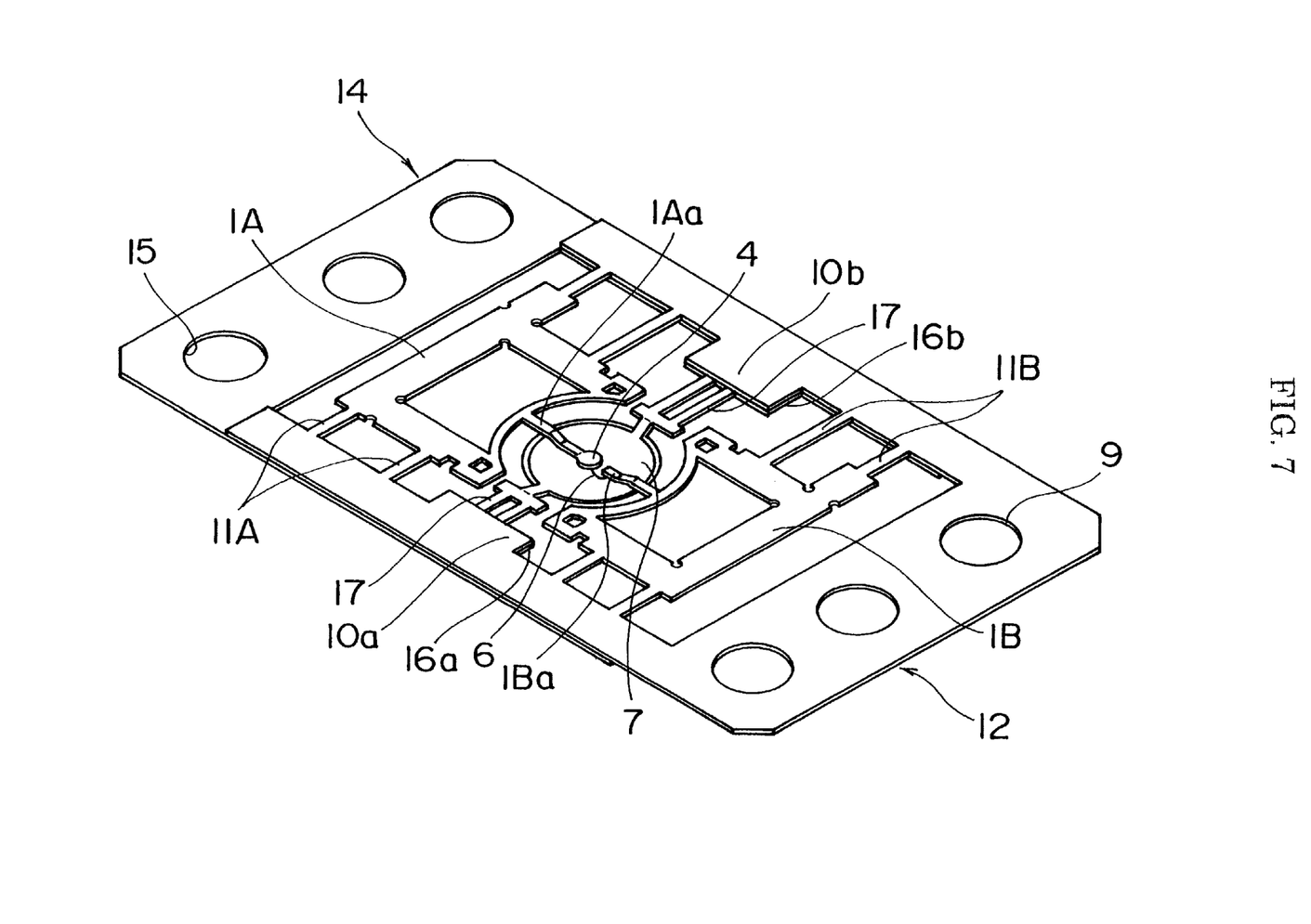
FIG. 7 is a partial enlarged perspective view showing how the leadframe stock with frame portions that is shown in FIG. 3 is joined to the concave reflector mirror stock with frame portions that is shown in FIG. 4.

Then, the projections 10a and 10b of the leadframe stock 12 with frame portions are superposed on the corresponding projections 16a and 16b of the concave reflector mirror stock 14 with frame portions as shown in FIG. 7. By spot welding the superposed projections, the leadframe 1A having the LED chip 5 mounted thereon, the leadframe 1B and the concave reflector mirror 7 can be combined into an integral assembly and the resulting monolithic sheet is set in a resin mold and molded with the light-transmissive resin 2, in which it is buried and fixed in such a way that the concave reflector mirror 7 which is the functional part of the lamp mechanism, the lead terminals 1Aa and 1Ba together with the LED chip 5, and the lead-ins 1Ab and 1Bb that support these lead terminals satisfy the specified positional relationship.

The resin molding is taken out of the mold and the exposed support bridges 11A and 11B are cut off the leadframe stock 12 with frame portions and, at the same time, the support bridges 17 are cut off the concave reflector mirror stock 14 with frame portions so that the individual frame portions 10 and 16 are severed to yield a plurality of stocks for lamp apparatus. Each of these stocks is then subjected to forming so that the leads bridges 1Ac and 1Bc of the leadframes 1A and 1B, respectively, are bent down along the outer lateral sides of the molding whereas the lead bases 1Ad and 1Bd are bent back to become level with the underside of the molding, thereby forming apparatus supporting surfaces on which the apparatus is to be joined to the substrate. Further, an end of each lead base is bent upward, whereupon the stock takes on the intended shape of the LED lamp apparatus A shown in FIGS. 1 and 2. The concave in the top surface of the light-transmissive resin 2 is processed to provide a specular finish, thereby forming a light pickup window 3, or a planar radiating surface. Being constructed in this way, the lamp apparatus A allows the light from the LED chip 5 to be reflected by the concave reflector mirror 7 and thereafter radiated in a forward direction from the light pickup window 3 without any optical leakage from lateral sides.

The foregoing embodiment is a preferred case for mass production, in which plural sets of leadframes are made from a single metal sheet and a corresponding number of concave reflector mirrors are also made from a single metal sheet. This is not the sole case of the present invention and, if necessary, the lamp apparatus may be manufactured from two metal sheets, one containing a set of leadframes and the other containing a single concave reflector mirror.

A salient feature of the lamp apparatus of the present invention is that the concave reflector mirror is completely surrounded by and buried in the light-transmissive resin and that it is insulated from the leadframes both thermally and electrically. As a result, the apparatus experiences no problems with its ability to radiate and reflect light and it is insensitive to the heat from reflow soldering during surface mounting on the substrate.

The leadframe stock with frame portions and the concave reflector mirror stock with frame portions may be made by etching rather than by blanking if size reduction of the apparatus is a critical design consideration. In any event, the two components of the lamp mechanism, i.e., the leadframes and the concave reflector mirror, can easily be made by blanking metal sheets with a press or by etching, followed by press forming and this results in a simplified manufacturing process and a higher rate of mass production. The rate of mass production is significantly improved if a plurality of lamp apparatus are manufactured simultaneously from a blank sheet containing more than one set of leadfames and another blank sheet containing more than one concave reflector mirror.

The lamp apparatus of the present invention is adapted to have a radiation from the LED chip reflected by the opposed concave reflector mirror so that it is focused to produce a very small beam spot. If the LED mounted in the apparatus is capable of emitting an infrared radiation, spatial transmission of an optical signal can be accomplished correctly so that it is pinpointed in a specified narrow range. In addition, the apparatus has a light converging function, so it can suppress the dispersion of light energy and thereby allow for spatial transmission of the light to a far-reaching distance. Because of these advantages, the apparatus of the present invention envisages the following preferred applications:

(i) spatial transmission of sound or image data from a video camera to a television monitor at least 5 m away that is equipped with a light-receiving device; (ii) spatial transmission of image data from a digital camera to a personal computer at least 5 m away that is equipped with a light-receiving device; (iii) measuring the distance between successively running automobiles from above a traffic signal; (iv) detecting an approaching object over a distance of 5 m or more; (v) controlling a consumer electric or electronic appliance that are equipped with a light-receiving device even if it is remote by a distance of 5 m or more; (vi) optical LAN for spatial transmission.

The advantages offered by the present invention may be summarized as follows.

First, a leadframe stock with frame portions that has an LED chip mounted thereon and a concave reflector mirror stock with frame portions that is prepared as a separate entity are joined by connecting the respective frame portions and after the essential parts of the stocks are completely surrounded with a light-transmissive resin to make an integral assembly, any unwanted portions such as frame portions including the joints are cut off; this procedure has the advantage of producing a lamp apparatus for use in optical communication that is mechanically rigid, that has no area sensitive to heat of reflow soldering during surface mounting on a substrate and that allows for efficient radiation of light.

Second, in the absence of a resin interface between the concave reflector mirror and the light-transmissive resin, the apparatus is free from the problem of functional deterioration due to permeation of air atmosphere and moisture.

Third, the apparatus can be manufactured by a simplified process so that the production time is substantially shortened and the cost of the apparatus is reduced.

Fourthly, if a glossy metal sheet or a metal sheet having a glossy metal plate is used, the concave reflector mirror can be made by a comparatively low-cost processing technique and, in the absence of the need to form a thin metal film by a cumbersome procedure such as evaporation, the use of expensive equipment is obviated to reduce the cost of the lamp apparatus. As an ancillary advantage, the concave reflector mirror need not be polished and, hence, can be produced with high precision and at low cost.

Fifthly, the making of the concave reflector mirror by blanking or etching a metal sheet and subsequent press forming is combined with the making of the leadframes by blanking or etching of a similar metal sheet and this results in a simplified manufacturing process. The present invention is by no means limited to the case where the two metal sheets are made of the same material and have the same thickness. However, if both metal sheets are made of the same material and have the same thickness, the overall manufacturing process including the step of applying the same plate can be further simplified.

Sixthly, the rate of mass production of the lamp apparatus is significantly improved by using two metal sheets, one containing more than one set of leadframes and the other containing a corresponding number of concave reflector mirrors.

Seventhly, if lead terminals are bent down such that they maintain a certain clearance from the concave reflector mirror, there is no need to provide grooves on the concave reflector mirror for assisting in the mounting of the lead terminals and yet there is produced an LED lamp that is capable of not only effective electrical insulation but also efficient radiation of light without any leakage.

Eighthly, if the leadframes exposed on the outside of the light-transmissive resin are bent down along the lateral sides of the resin molding, with their end portions being bent back to become level with the underside of the molding, there is provided a lamp apparatus that is not only rigid and compact but which can be easily surface mounted on a substrate.

Ninthly, the lamp apparatus of the present invention allows the radiation from the LED to travel straight and focused to a specified, comparatively distant, narrow area, thereby permitting its spatial transmission without using optical fibers yet offering various applications such as data transmission from a video camera to a television monitor or from a digital camera to a computer and optical LAN for spatial transmission.

What is claimed is:

1. A lamp apparatus for use in optical communication that comprises leadframes having an LED chip mounted on a lead terminal and a material having a concave reflector mirror opposed to said LED chip and which is resin molded monolithically with said leadframes, said lamp apparatus being produced by a process comprising the steps of:
    making a unitary assembly of a metallic leadframe stock with frame portions on which leadframes are supported by means of support bridges and a concave reflector mirror stock with frame portions on which a concave reflector mirror is supported by means of support bridges, said unitary assembly being formed by joining the frame portions of the leadframe stock to those of the concave reflector mirror stock;
    completely burying said LED chip, said lead terminal and said concave reflector mirror within a light-transmissive resin by molding; and
    cutting off the support bridges of said leadframe and those of said concave reflector mirror so that the frame portions of the respective components are severed.

2. The lamp apparatus for use in optical communication according to claim 1, wherein said leadframe stock with frame portions is obtained from a metal sheet by blanking or etching.

3. The lamp apparatus for use in optical communication according to claim 1, wherein said concave reflector mirror stock with frame portions is obtained by first blanking or etching a metal sheet and then press forming it.

4. The lamp apparatus for use in optical communication according to claim 1, wherein said lead terminal is bent such that it straddles a peripheral edge of said concave reflector mirror without contacting it.

5. The lamp apparatus for use in optical communication according to claim 1, wherein said leadframe stock with frame portions and said concave reflector mirror stock with frame portions are obtained from metallic sheets of the same material and thickness.

6. The lamp apparatus for use in optical communication according to claim 1, wherein a central area of an underside of said light-transmissive resin in which said lead terminal and said concave reflector mirror are buried is shaped to protrude downwardly, and those portions of a pair of said leadframes which are exposed to the outside of said light-transmissive resin are bent downward along outer lateral sides of said light-transmissive resin whereas the end portions of said leadframes are bent back to become level with the underside of said light-transmissive resin, thereby forming apparatus supporting surfaces.

7. A process for producing a lamp apparatus for use in optical communication that comprises leadframes having an LED chip mounted on a lead terminal and a material having a concave reflector mirror opposed to said LED chip and which is resin molded monolithically with said leadframes, said process comprising the steps of:
    blanking or etching a metal sheet to make a leadframe stock with frame portions on which leadframes are supported by means of support bridges;
    blanking or etching a metal sheet and press forming it to make a concave reflector mirror stock with frame portions on which a concave reflector mirror is supported by means of support bridges;
    forming a unitary assembly of said leadframes and said concave reflector mirror by joining their respective frame portions;
    completely burying said LED chip, said lead terminal and said concave reflector mirror within a light-transmissive resin by molding them with the resin; and
    cutting off the support bridges of said leadframes and those of said concave reflector mirror so that the frame portions of the respective components are severed.

8. The process for producing a lamp apparatus for use in optical communication according to claim 7, wherein a plurality of said leadframe stocks with frame portions are formed in a single metal sheet and a corresponding number of said concave reflector mirror stocks with frame portions are formed in a single metal sheet and said leadframe stocks are joined to corresponding concave reflector mirror stocks, molded with a resin altogether and followed by resin molding of the entire assembly and severing of the respective frame portions so as to produce a plurality of lamp apparatus simultaneously.

* * * * *